(12) United States Patent
Cea et al.

(10) Patent No.: US 8,269,283 B2
(45) Date of Patent: Sep. 18, 2012

(54) METHODS AND APPARATUS TO REDUCE LAYOUT BASED STRAIN VARIATIONS IN NON-PLANAR TRANSISTOR STRUCTURES

(75) Inventors: Stephen M. Cea, Hillsboro, OR (US); Martin D. Giles, Portland, OR (US); Kelin Kuhn, Aloha, OR (US); Jack T. Kavalieros, Portland, OR (US); Markus Kuhn, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 277 days.

(21) Appl. No.: 12/653,971

(22) Filed: Dec. 21, 2009

(65) Prior Publication Data

US 2011/0147847 A1    Jun. 23, 2011

(51) Int. Cl.
*H01L 21/70* (2006.01)

(52) U.S. Cl. ............ 257/368; 257/213; 257/E21.546; 257/E29.246; 257/E29.028; 257/E29.067

(58) Field of Classification Search ............ 257/368, 257/213, E21.546, E29.246, E29.028, E29.067
See application file for complete search history.

(56) References Cited

U.S. PATENT DOCUMENTS

| 6,914,277 | B1 * | 7/2005 | Hill et al. ............ 257/213 |
| 7,312,485 | B2 | 12/2007 | Armstrong et al. |
| 7,799,592 | B2 * | 9/2010 | Lochtefeld ............ 438/44 |
| 2008/0036005 | A1 | 2/2008 | Armstrong et al. |
| 2008/0142841 | A1 | 6/2008 | Lindert et al. |
| 2009/0078999 | A1 * | 3/2009 | Anderson et al. ............ 257/348 |

\* cited by examiner

*Primary Examiner* — David Vu
*Assistant Examiner* — Brandon Fox
(74) *Attorney, Agent, or Firm* — Winkle, PLLC

(57) ABSTRACT

The present disclosure relates to the field of fabricating microelectronic devices. In at least one embodiment, the present disclosure relates to forming isolation structures in strained semiconductor bodies of non-planar transistors while maintaining strain in the semiconductor bodies.

8 Claims, 10 Drawing Sheets

METHODS AND APPARATUS TO REDUCE LAYOUT BASED STRAIN VARIATIONS IN NON-PLANAR TRANSISTOR STRUCTURES

BACKGROUND OF THE INVENTION

Microelectronic integrated circuits, such as microprocessors, comprise literally hundreds of millions of transistors. The speed of the integrated circuits is primarily dependent on the performance of these transistors. Thus, the industry has developed unique structures, such as non-planar transistors, and the use of straining techniques on components within the transistors to improve performance.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
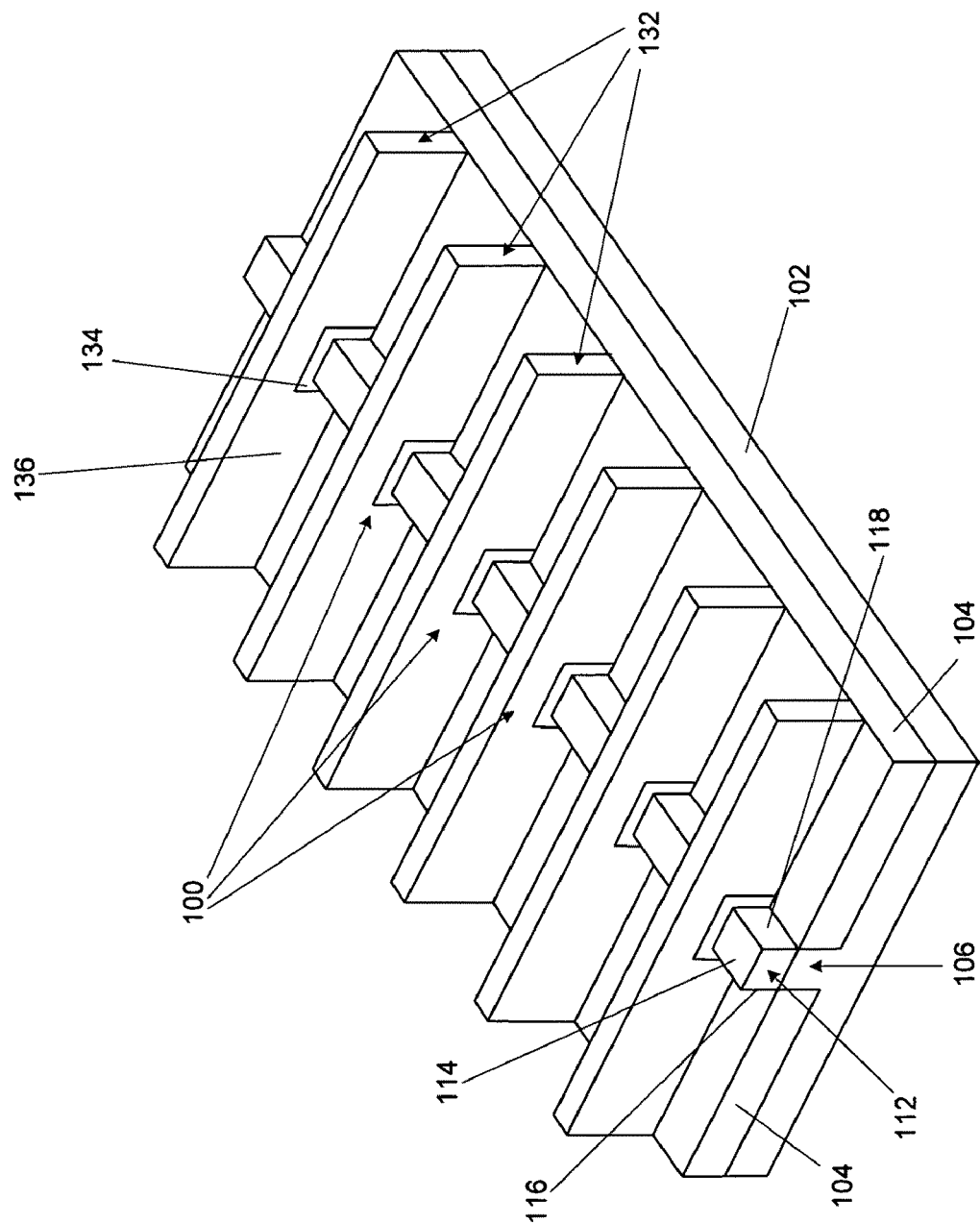
FIG. 1 is a perspective view of non-planar transistors.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the fabrication of microelectronic devices. In at least one embodiment, the present subject matter relates to forming isolation structures in semiconductor bodies of non-planar transistors.

In the fabrication of non-planar transistors, such as tri-gate transistors, FinFETs, omega-FETs, and double-gate transistors, non-planar semiconductor bodies may be used to form transistors capable of full depletion with very small gate lengths (e.g., less than about 30 nm). For example in a tri-gate transistor, the semiconductor bodies generally have a fin-shape with a top surface and two opposing sidewalls formed on a bulk semiconductor substrate or a silicon-on-insulator substrate. A gate dielectric may be formed on the top surface and sidewalls of the semiconductor body and a gate electrode may be formed over the gate dielectric on the top surface of the semiconductor body and adjacent to the gate dielectric on the sidewalls of the semiconductor body. Thus, since the gate dielectric and the gate electrode are adjacent to three surfaces of the semiconductor body, three separate channels and gates are formed. As there are three separate channels formed, the semiconductor body can be fully depleted when the transistor is turned on.

Semiconductor bodies are generally formed of silicon-containing materials, and, as will be understood to those skilled in the art, inducing strain in silicon-containing materials can enhance channel mobility. An increase in channel mobility can result in advantages, including but not limit to, reduced electrical resistance, improved efficiency, increased current, and increased speed. Strain may be induced on a semiconductor body by using materials that have lattice mismatch in their crystalline structures. For example, when silicon germanium and silicon are used to the form the semiconductor body and the semiconductor substrate, the difference in lattice parameter between silicon germanium and silicon can cause the silicon germanium to be strained. Epitaxially grown strained silicon germanium is one example of a strained film grown on a silicon substrate.

FIG. 1 is a perspective view of a number of transistors 100 including a number gates formed on a strained semiconductor body, which is formed on a substrate. In an embodiment of the present disclosure, the substrate 102 may be a monocrystalline silicon substrate or a silicon-on-insulator substrate having are a pair of spaced apart isolation regions 104, such as shallow trench isolation (STI) regions, which define the substrate active region 106 therebetween. The substrate 102, however, need not necessarily be a silicon monocrystalline substrate and can be other types of substrates, such as a germanium, a gallium arsenide, indium antimonide, lead telluride, indium arsenide, indium phosphide, gallium arsenide, gallium antimonide, and the like, any of which may be combined with silicon. The isolations regions 104 maybe be formed by forming trenches in the substrate 102 filling the trenches with an electrically insulative material, such as silicon oxide ($SiO_2$).

Each transistor 100, shown as tri-gate transistors, includes a semiconductor body 112 formed adjacent the substrate active region 106. The semiconductor body 112 may have a top surface 114 and a pair of laterally opposite sidewalls, sidewall 116 and opposing sidewall 118. The semiconductor body 112 may be a monocrystalline or single crystalline semiconductor film. In an embodiment of the present disclosure, the semiconductor body 112 is formed from a semiconductor material different than the material used to form the substrate 102. In another embodiment of the present disclosure, the semiconductor body 112 is formed from a single crystalline semiconductor having a different lattice constant or size than the bulk semiconductor substrate 102 so that the semiconductor body 112 will have a strain induced therein. In one embodiment of the present disclosure, the semiconductor substrate 102 is a monocrystalline silicon substrate and the semiconductor body 112 is a single crystalline silicon germanium alloy. The percentage of germanium may be chosen to optimize transistor performance, as will be understood to those skilled in the art.

As further shown in FIG. 1, at least one gate 132 may be form over the semiconductor body 112. A gate 132 may be fabricated by forming a gate dielectric layer 134 on or adjacent to the top surface 114 and on or adjacent to the pair of laterally opposing sidewalls 116, 118 of the semiconductor body 112, and forming a gate electrode 136 on or adjacent the gate dielectric layer 134.

The gate dielectric layer 134 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 134 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

As shown in FIG. 1, the gate electrode 136 may be formed on or adjacent to the gate dielectric layer 134. The gate electrode 136 can be formed by well-known techniques, such as by depositing a gate electrode material, such as chemical vapor deposition ("CVD"), physical vapor deposition ("PVD"), atomic layer deposition ("ALD"), and then patterning the gate electrode material with well-known photolithography and etching techniques, as will be understood to those skilled in the art.

The "width" of transistor is equal to the height (not shown) of semiconductor body 112 at the sidewall 116, plus the width (not shown) of semiconductor body of 112 at the top surface 114, plus the height (not shown) of semiconductor body 112 at the opposing sidewall 118. In an implementation of the present disclosure, the semiconductor body 112 runs in a direction substantially perpendicular to the gates 132.

The gate electrode 136 can be formed of any suitable gate electrode material. In an embodiment of the present disclosure, the gate electrode 136 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 136 can be formed by well-known techniques, such as by blanket depositing a gate electrode material and then patterning the gate electrode material with well-known photolithography and etching techniques, as will be understood to those skilled in the art.

It is understood that a source region and a drain region (not shown) may be formed in the semiconductor body 112 on opposite sides of the gate electrode 136. The source and drain regions may be formed of the same conductivity type, such as N-type or P-type conductivity. The source and drain regions may have a uniform doping concentration or may include sub-regions of different concentrations or doping profiles such as tip regions (e.g., source/drain extensions). In some implementations of an embodiment of the present disclosure, the source and drain regions may have the substantially the same doping concentration and profile while in other implementations they may vary.

Figure 2:
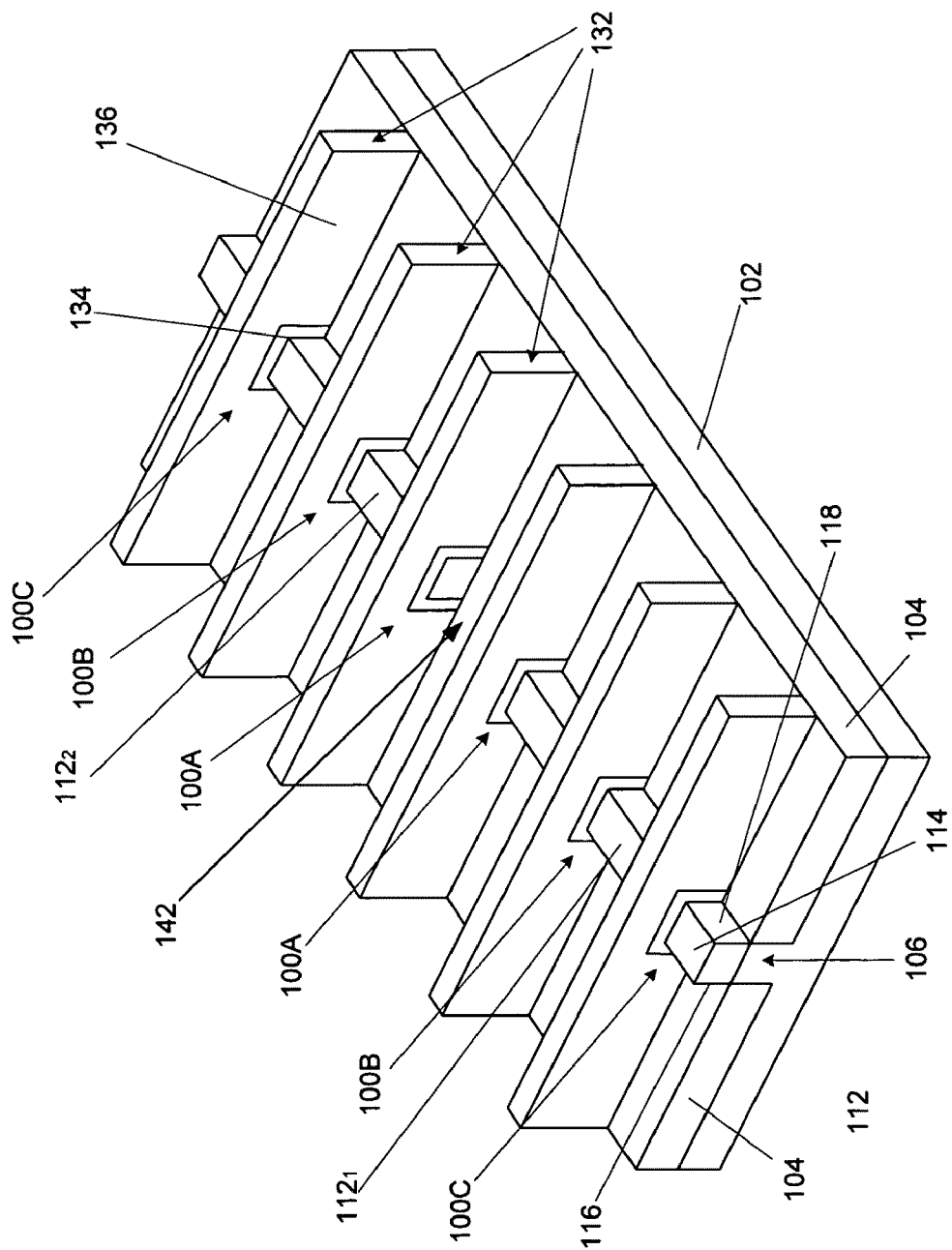
FIG. 2 is a perspective view of non-planar transistors having a gap in a semiconductor body of the non-planar transistors.

In the fabrication of the transistors 100, as shown in FIG. 2, relatively long semiconductor body 112 and/or bodies may be formed, then portions thereof removed to form a gap 142 either before or after the formation of the gates 132. The formation of the gap 142 or gaps forms a desired length for the semiconductor body by electrically isolating one portion 112$_1$ of the semiconductor body from another portion 112$_2$. The desired length is determined by the numbers of gates 132 to be formed along a particular portion of the semiconductor body 112. However, the gap 142 forms a free surface edge can result in a relaxation of the strain on the semiconductor body 112 proximate the gap 142. This relaxation extends, as a decreasing function, along the length of the semiconductor body away from the gap 142, which results in varying performance from transistor to the next. For example, transistors 100A would be less efficient than transistors 100B; transistors 100B would be less efficient than transistors 100C, and so on.

Figure 3:
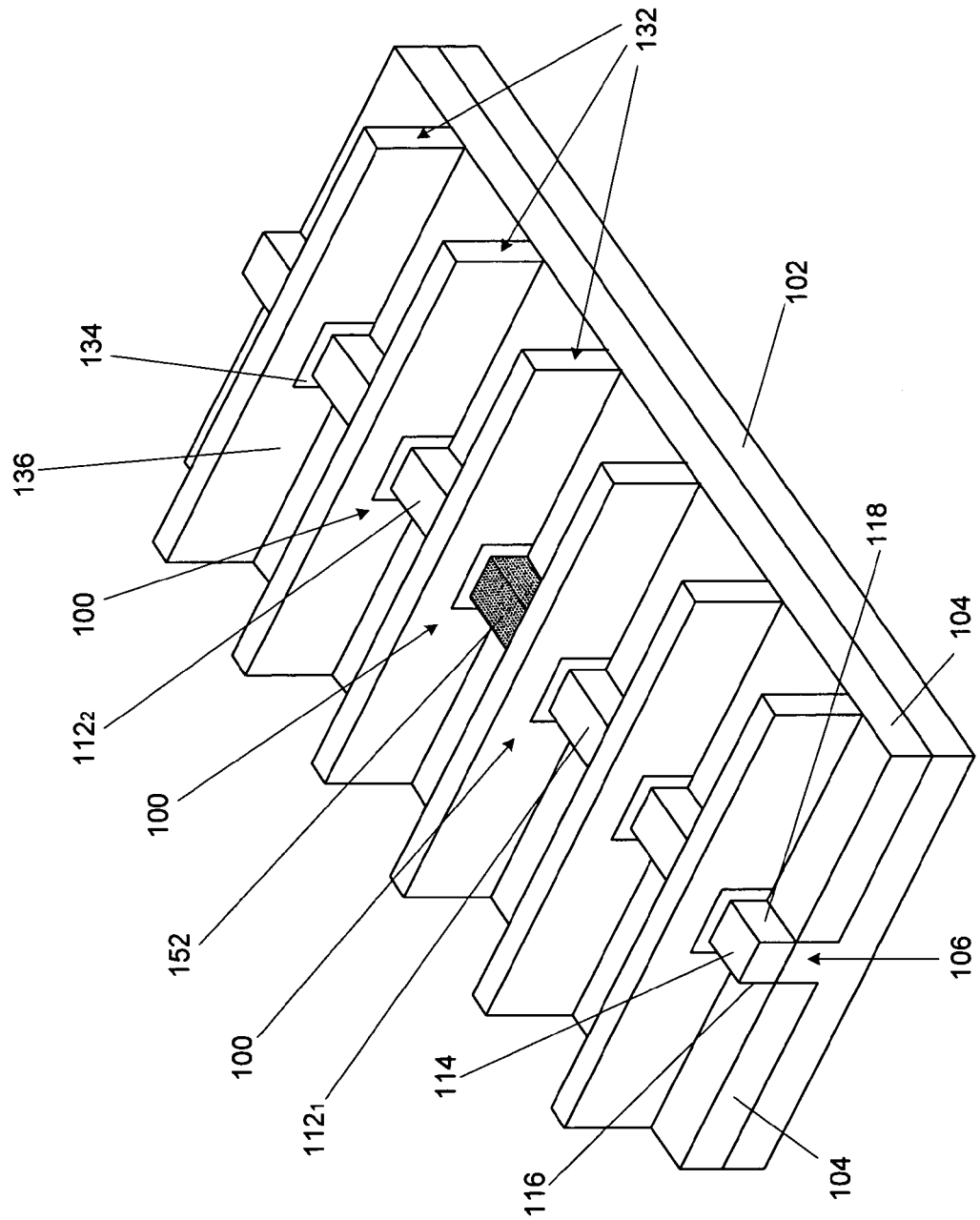
FIG. 3 is a perspective view of non-planar transistors having an isolation zone formed in a semiconductor body of the non-planar transistors.

As shown in FIG. 3, in an embodiment of the present disclosure, an isolation zone 152 may be formed in the semiconductor body 112 which results in the formation of a semiconductor body first portion 112$_1$ and a semiconductor body second portion 112$_2$, which are substantially electrically isolated from one another by the isolation zone 152. Since the isolation zone 152 is formed in the semiconductor body 112 rather than forming a gap therein, no free surfaces are created in the current flow direction. Thus, there will be less strain variation as a function of the length in the semiconductor body first portion 112$_1$ and the semiconductor body second portion 112$_2$.

Figure 4A:
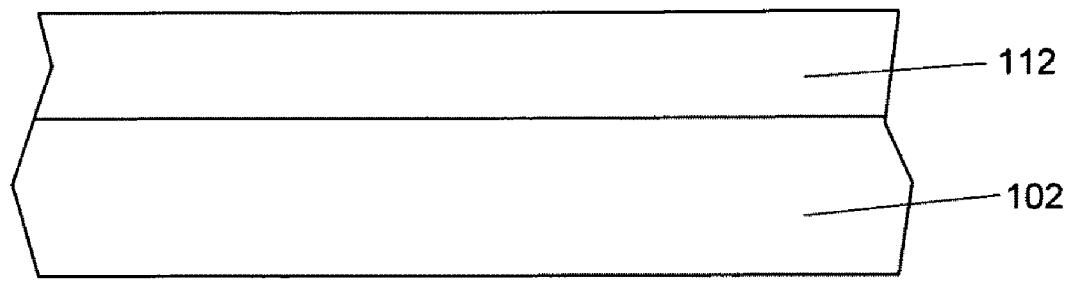
FIGS. 4a-4d are side cross-sectional views of forming an isolation zone in a semiconductor body by implantation of impurities.
Figure 4B:
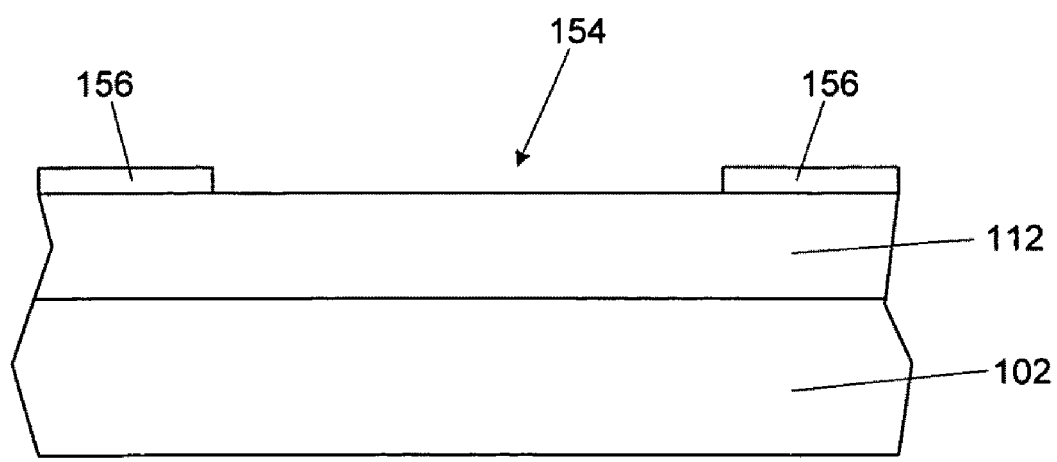
Figure 4C:
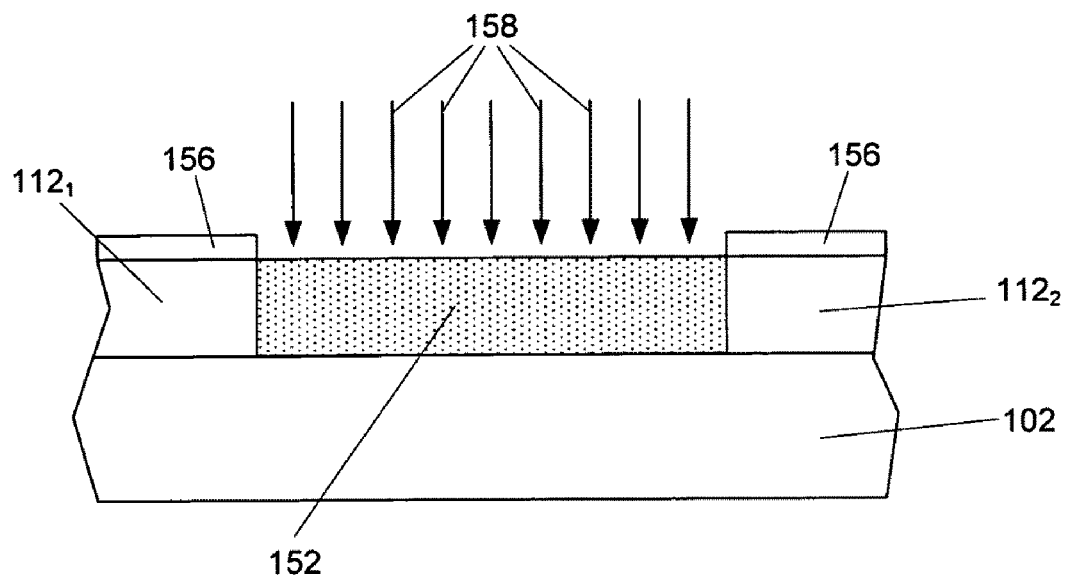
Figure 4D:
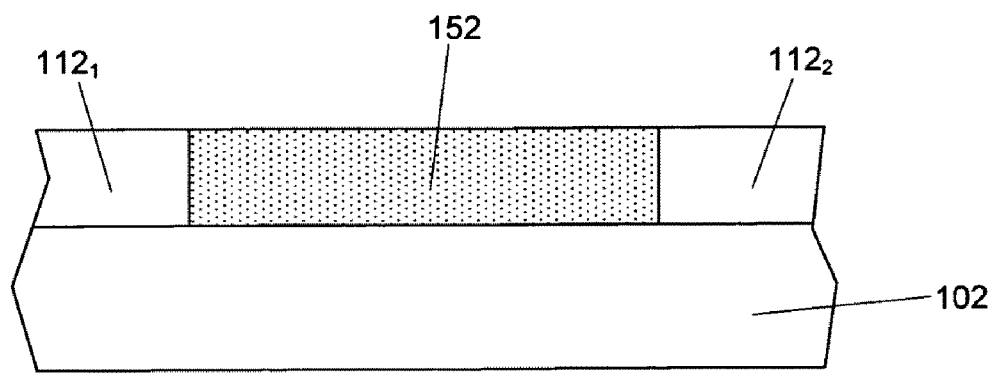
Figure 5:
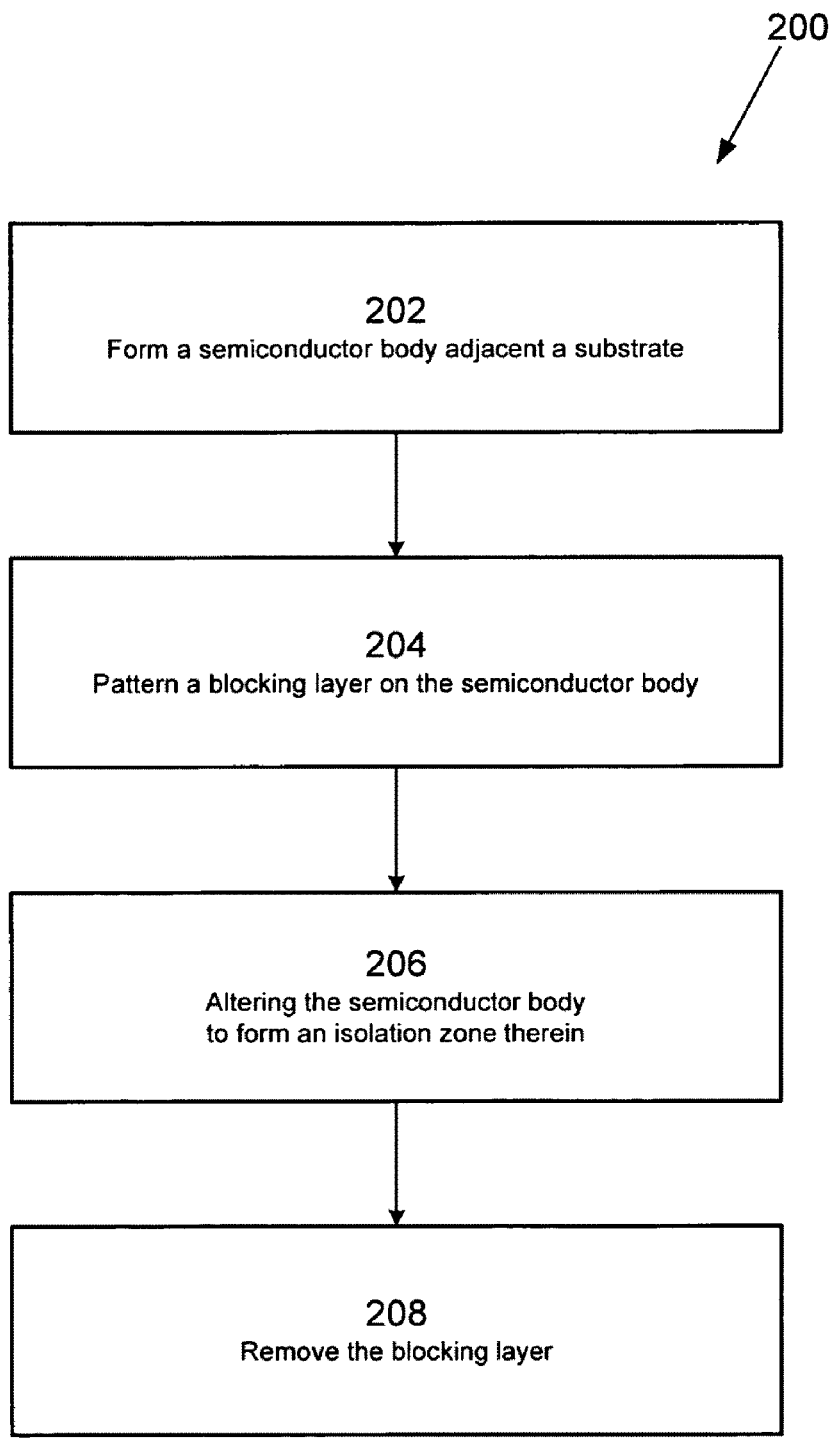
FIG. 5 is a flow diagram of the process of FIGS. 4a-4d.

FIGS. 4a-4d illustrate cross-sections of structures that are formed when the method 200 of FIG. 5 is carried out, wherein the isolation zone 152 may be formed by embedding materials within the semiconductor body 112 to form a poorly conductive or completely dielectric zone, i.e. the isolation zone 152. As shown in FIG. 4a, the semiconductor body 112 may be deposed adjacent the substrate 102 (block 202). As shown in FIG. 4b, a blocking layer 156 is patterned with at least one opening 154 exposing portion of the semiconductor body 112 (block 204). The semiconductor body 112 may then be altered (block 206). In one embodiment of altering the semiconductor body 112, the structure of FIG. 4c has impurities (shown with arrows 158), such as oxygen or nitrogen, imbedded into the semiconductor body 112 to form an insulator or poor conduction zone, i.e. the isolation zone 152 (block 206), thereby substantially electrically separating the first portion 112$_1$ of the semiconductor body 112 from the second portion 112$_2$ of the semiconductor body 112. In one embodiment of the present disclosure, the imbedding of the impurities 158 (block 206) may be achieved with a high dose implantation process followed by annealing, as known in the art. Although oxygen and nitrogen have been mentioned for exemplary purposes, it is understood that other implant species (e.g. impurities) could be used to amorphize the semiconductor body 112 and form the isolation zone 152.

In another embodiment of altering the semiconductor body 112 (block 206), the exposed portion of the semiconductor body 112 (FIG. 4b) may be oxided, such as by a chemical reaction, to create the isolation region 152. In an embodiment where the semiconductor body 112 is formed of silicon germanium, the oxidation will cause a condensation of the germanium toward the portions of the semiconductor body 112 not exposed to the oxidation chemical resulting a silicon oxide insulator for the isolation zone 152 and an increased concentration of germanium in the first portion $112_1$ and the second portion $112_2$ of the silicon germanium semiconductor body 112 on either side of the silicon oxide insulation zone 152. The oxidation process may be a thermal oxidation process at a temperature of between about 600 and 1200 degrees Celsius in a molecular oxygen environment.

As shown in FIG. 4d, once the isolation zone 152 is formed, the blocking layer 156 may be removed (block 208). It is understood that the method 200 of FIG. 5 may be performed before the semiconductor body 112 is patterned on the substrate 102 or may even be formed after the formation of the gates 132 (see FIG. 1). It is further understood that this method may be in applied to a variety of semiconductor bodies, including non-planar transistors with epitaxial silicon germanium source drain stressors, and non-planar transistors with semiconductor bodies having silicon germanium cores formed on an insulation layer with silicon shell layers formed on three sides of the silicon germanium cores to induce the strain for enhancement of the mobility of electrons and holes in the silicon shell layers, as will be understood to those skilled in the art.

Figure 6A:
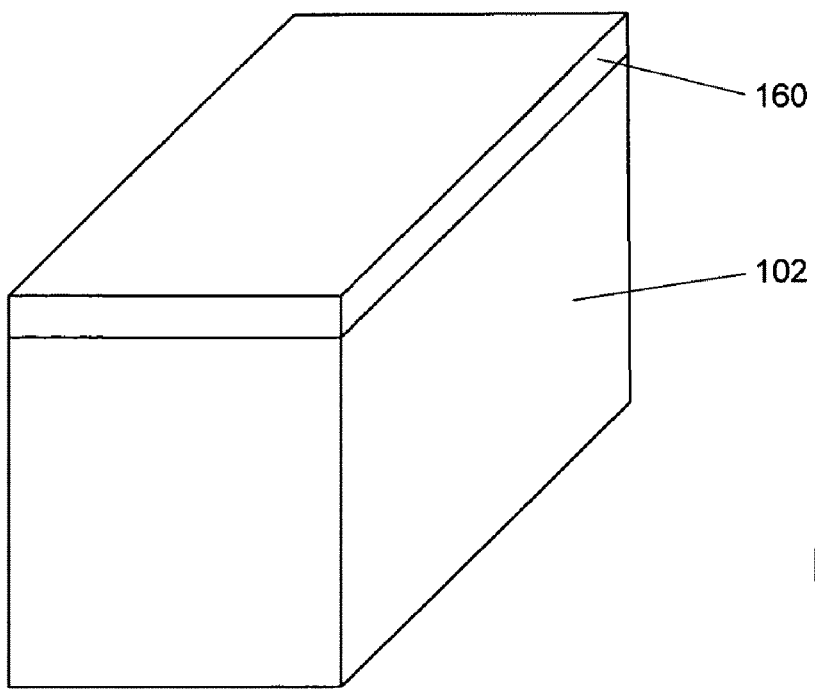
FIGS. 6a-6f are side cross-sectional views of forming an isolation zone in a semiconductor body by forming an isolation trench.
Figure 6B:
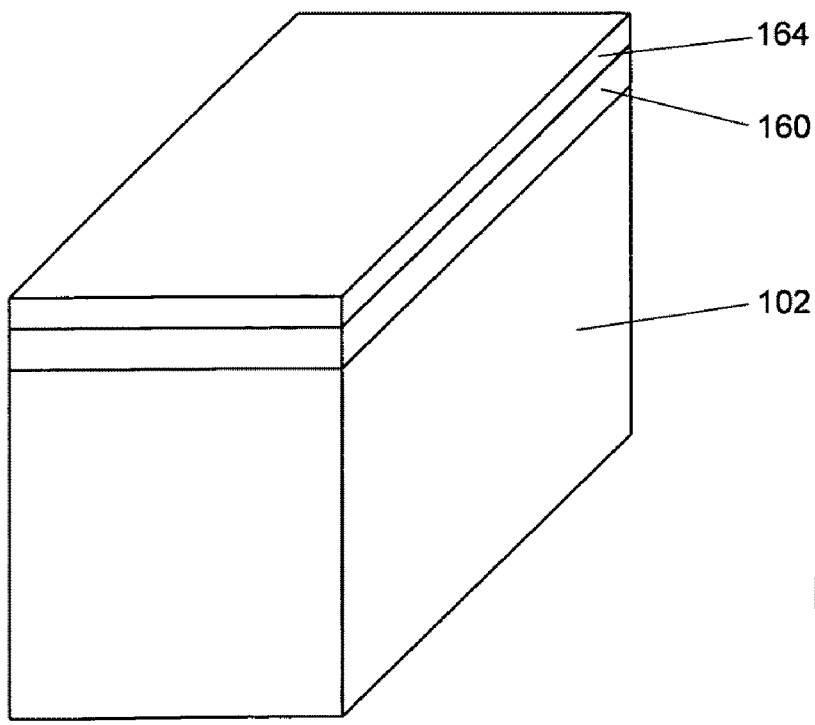
Figure 6C:
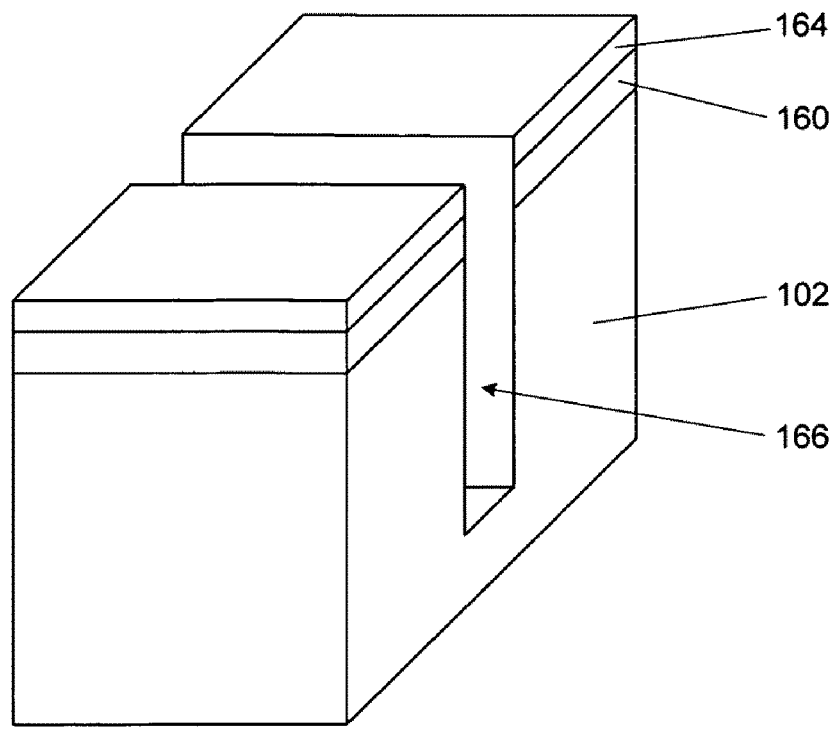
Figure 6D:
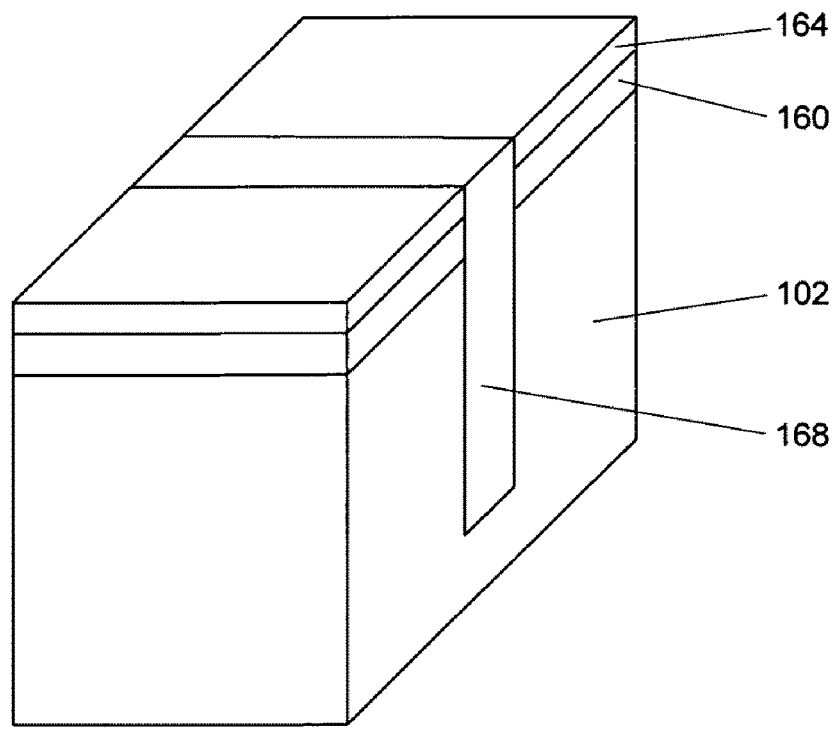
Figure 6E:
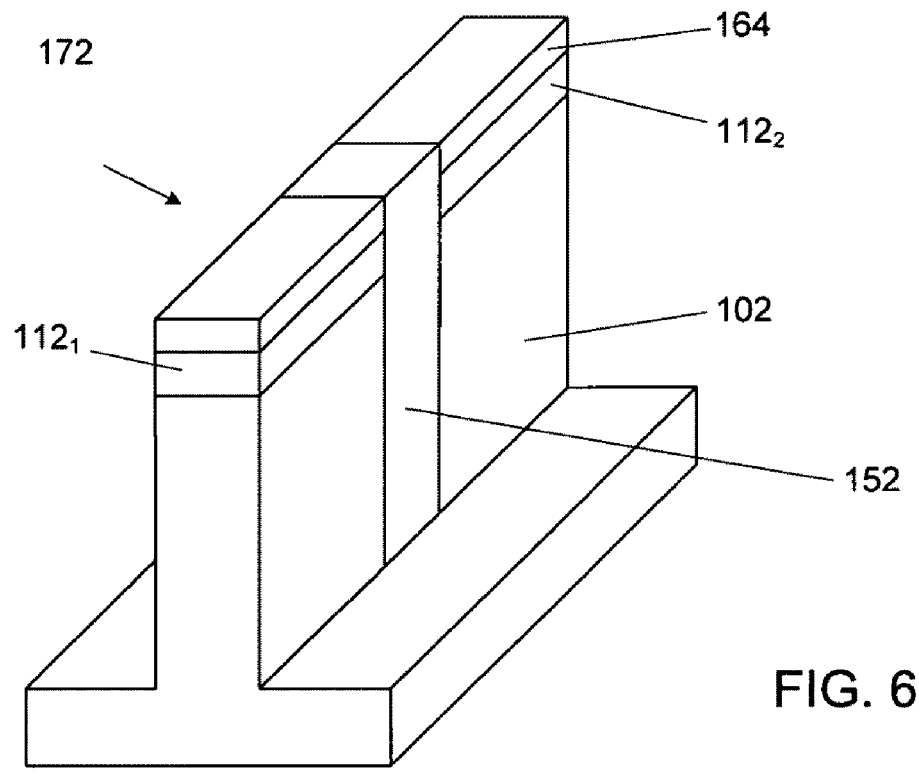
Figure 6F:
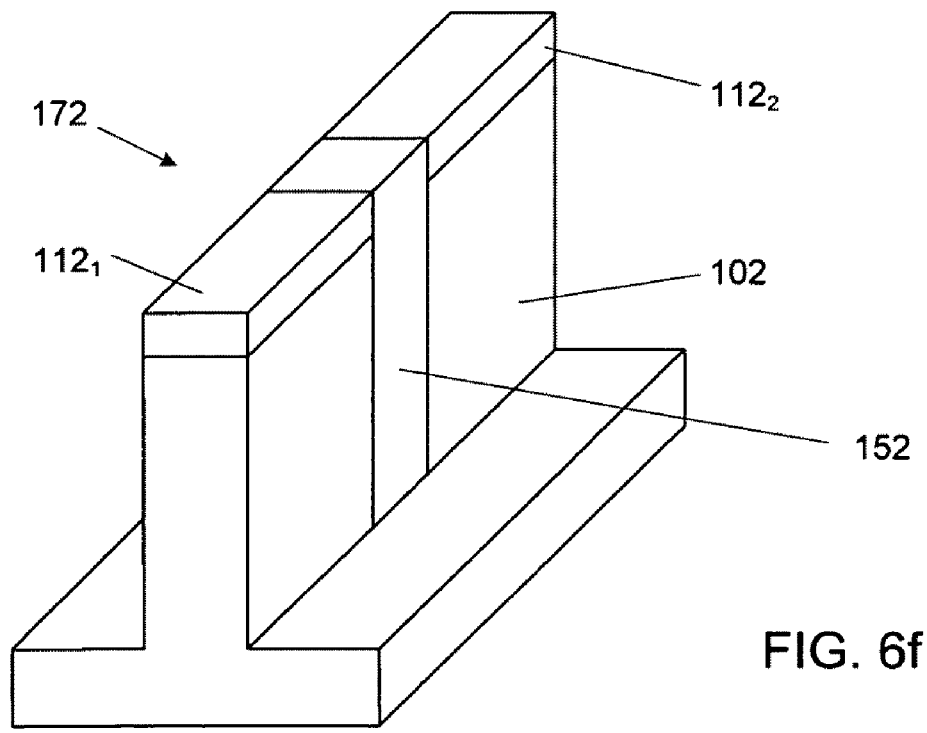
Figure 7:
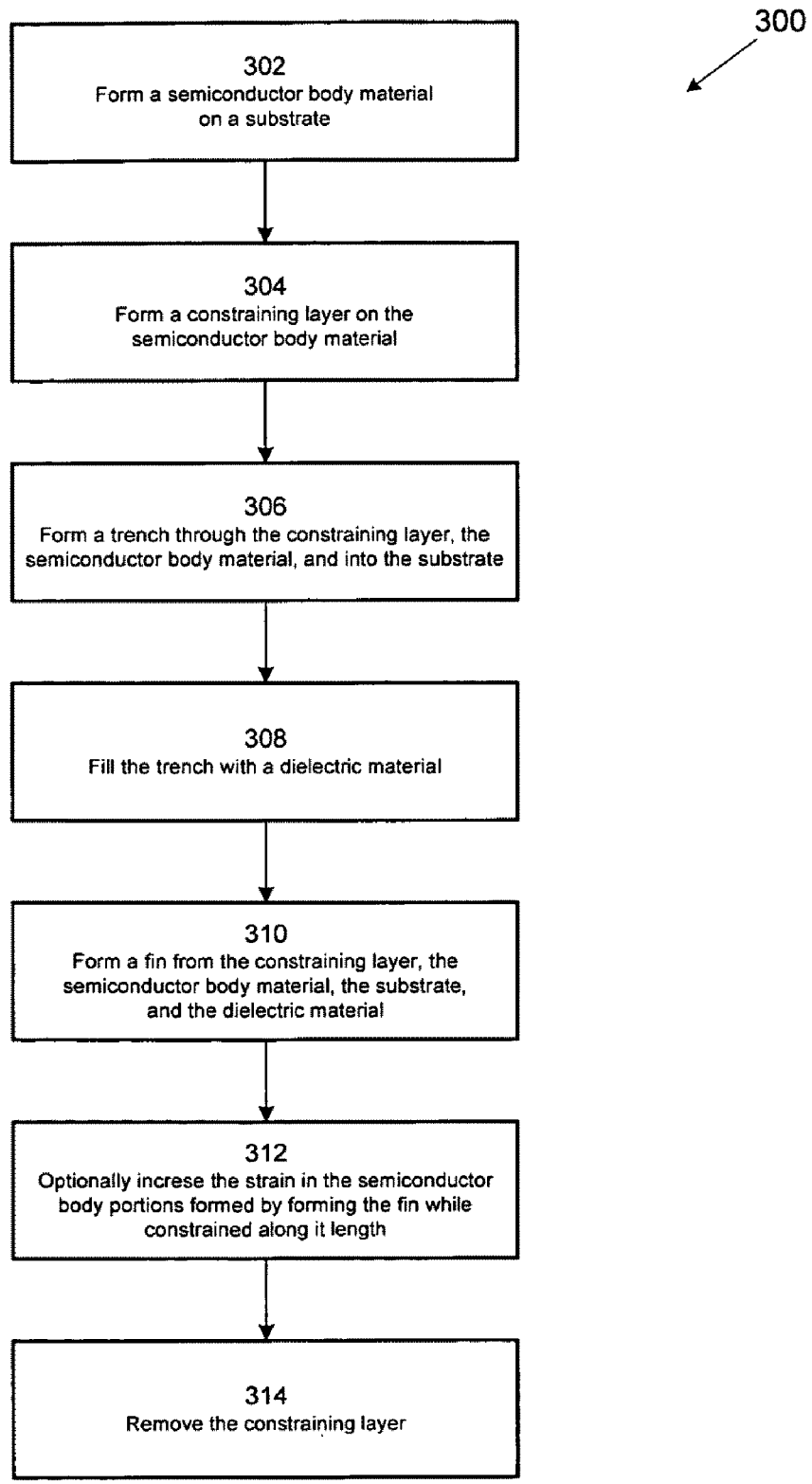
FIG. 7 is a flow diagram of the process of FIGS. 6a-6f.

FIGS. 6a-6f illustrate cross-sections of structures that are formed when the method 300 of FIG. 7 is carried out, wherein the isolation zone 152 may be formed while constraining the material used to form the semiconductor body 112. As shown in FIG. 6a, a semiconductor body material 160, such as silicon germanium, is formed on a substrate 102, such as a silicon substrate (block 302), which creates a strain due to the crystal lattice mismatch there between. As shown in FIG. 6b, a constraining layer 164, such as silicon nitride, is formed on the semiconductor body material 160 (block 304) to assist in maintaining the strain due to the crystal lattice mismatch. As shown in FIG. 6c, a trench 166 may be formed through the constraining layer 164, through the semiconductor body material 160, and into the substrate 102 (block 306). The trench 166 may be formed by any technique known in the art, including but not limited to lithography and laser or ion ablation.

The trench 166 then filled with a dielectric material 168 (block 308), as shown in FIG. 6d. The dielectric material 168 may be any appropriate dielectric material, including but not limited to silicon dioxide ($SiO_2$), silicon oxynitride ($SiO_xN_y$), silicon nitride ($Si_3N_4$), and high-k dielectric materials. The dielectric material 168 may be disposed within the trench 166 (see FIG. 6c) by any technique including grown by oxidation, chemical vapor deposition, physical vapor deposition, atomic layer deposition, and the like.

As shown in FIG. 6e, a fin structure 172 may be formed from the structure of FIG. 6d (block 310) which also forms the semiconductor body first portion $112_1$ and the semiconductor body second portion $112_2$. The fin structure 172 may be formed substantially perpendicular to the trench 166. The fin structure 172 may be formed by any technique known in the art, including but not limited to lithography and laser or ion ablation.

After the formation of the fin structure 172, the semiconductor body 112 may be strained (block 312). In an embodiment, where the semiconductor body first portion $112_1$ and the semiconductor body second portion $112_2$ comprise silicon germanium, the fin structure 172 may be strained with an oxidation reaction, which will cause a condensation of the germanium toward the interior of the semiconductor body first portion $112_1$ and the semiconductor body second portion $112_2$. This condensation will thin the semiconductor body first portion $112_1$ and the semiconductor body second portion $112_2$ and increase the strain in the fin structure 172 and because the ends 174 of the fin structures 172 are constrained along the length of the fin structure 172 (current flow direction), the strain will be more uniform as a function of the fin structure length. The oxidation reaction may be a thermal oxidation process at a temperature of between about 600 and 1200 degrees Celsius in a molecular oxygen environment.

As shown in FIG. 6f, the constraining layer 164 may be removed (block 314) and may be further processed to form transistors 100, as shown in FIG. 1 with the exception that the dielectric material 168 within the trench 166 should not be altered or recessed, as strain in the semiconductor body first portion $112_1$ and the semiconductor body second portion $112_2$ might be relieved. It is, of course, understood that the constraining layer may be removed before the straining of the semiconductor body first portion $112_1$ and the semiconductor body second portion $112_2$, i.e. block 312 of FIG. 7.

It is understood that if the constraining layer 164 is a sufficiently thick, the strain in the semiconductor body material 160 from its formation may be maintained enough even when the trench 166 is formed. Thus, the step of straining the semiconductor body first portion $112_1$ and the semiconductor body second portion $112_2$ of block 312 in FIG. 7 would not be necessary.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A non-planar transistor formed by a method comprising:
    forming a semiconductor body material adjacent a substrate, wherein a crystal lattice mismatch exists between the semiconductor body material and the substrate;
    forming a constraining layer adjacent the semiconductor body material;
    forming a trench through the constraining layer and the semiconductor body material while maintaining the crystal lattice mismatch between the semiconductor body material and the substrate; and
    substantially filling the trench with a dielectric material.

2. The non-planar transistor of claim 1, wherein forming a semiconductor body on a substrate comprises forming a silicon germanium semiconductor body on a silicon substrate.

3. The non-planar transistor of claim 1, wherein the constraining layer, the semiconductor body material, and the dielectric material forms a fin structure in which a semiconductor body first portion and a semiconductor body second portion are formed from the semiconductor body material and an isolation zone is formed from the dielectric material that substantially electrically separates the semiconductor body first portion and the semiconductor body second portion.

4. The non-planar transistor of claim 3, further including straining the semiconductor material of the fin structure.

5. The non-planar transistor of claim 4, wherein straining the semiconductor material of the fin structure comprises oxidizing the semiconductor material of the fin structure.

6. The non-planar transistor of claim 3, further including forming at least one gate over the fin structure.

7. The non-planar transistor of claim 1, wherein forming a trench through the constraining layer and the semiconductor body material comprising forming a trench through the constraining layer, the semiconductor body material, and into the substrate.

8. The non-planar transistor of claim 1, further including removing the constraining layer.

* * * * *